US007733695B2

(12) United States Patent
Kim et al.

(10) Patent No.: US 7,733,695 B2
(45) Date of Patent: Jun. 8, 2010

(54) NON-VOLATILE MEMORY DEVICE AND METHOD OF OPERATION THEREFOR

(75) Inventors: Dae-Yong Kim, Hwaseong-si (KR); Sang-Won Hwang, Suwon-si (KR); Jun-Yong Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 11/653,866

(22) Filed: Jan. 17, 2007

(65) Prior Publication Data
US 2007/0195609 A1    Aug. 23, 2007

(30) Foreign Application Priority Data
Feb. 17, 2006    (KR) ............... 10-2006-0015821

(51) Int. Cl.
*G11C 16/04*    (2006.01)
(52) U.S. Cl. .................... 365/185.05; 365/185.12; 365/185.17; 365/185.18; 365/185.23; 365/185.25; 365/185.26; 365/185.27; 365/185.33
(58) Field of Classification Search ............ 365/185.05, 365/185.12, 185.17, 185.18, 185.23, 185.25, 365/185.26, 185.27, 185.33
See application file for complete search history.

(56) References Cited

U.S. PATENT DOCUMENTS

| 5,805,498 | A * | 9/1998 | Lee et al. ............... | 365/185.17 |
| 6,091,657 | A | 7/2000 | Chen et al. | |
| 6,373,746 | B1 * | 4/2002 | Takeuchi et al. ....... | 365/185.03 |
| 7,366,018 | B2 * | 4/2008 | Shibata .................. | 365/185.18 |
| 2005/0093047 | A1 | 5/2005 | Goda et al. | |
| 2005/0139904 | A1 | 6/2005 | Kamigaichi et al. | |
| 2005/0213378 | A1 * | 9/2005 | Chang .................... | 365/185.03 |

FOREIGN PATENT DOCUMENTS

| JP | 2000-294658 | 10/2000 |
| JP | 2005-116551 | 4/2005 |
| JP | 2005-197308 | 7/2005 |
| KR | 10-1997-7000943 | 2/1997 |
| KR | 10-2000-0002072 | 1/2000 |
| KR | 10-2001-0010734 | 2/2001 |
| KR | 10-0445794 | 8/2004 |

(Continued)

OTHER PUBLICATIONS

European Search Report issued in connection with corresponding European Patent Application No. 07250657.9 mailed on Aug. 10, 2007.

*Primary Examiner*—Hoai V Ho
*Assistant Examiner*—Fernando N Hidalgo
(74) *Attorney, Agent, or Firm*—Harness, Dickey & Pierce, P.L.C.

(57) ABSTRACT

In one embodiment, the non-volatile memory device includes a well of a first conductivity type formed in a substrate, and a first plurality of memory cell transistors connected in series to a bit line formed in the well. A buffer is formed in the substrate outside the well and is connected to the bit line. At least one de-coupling transistor is configured to de-couple the buffer from the bit line, and the de-coupling transistor is formed in the well.

15 Claims, 9 Drawing Sheets

FOREIGN PATENT DOCUMENTS

| KR | 10-2005-0033033 | 4/2005 |
| KR | 10-2005-0066607 | 6/2005 |
| KR | 10-2005-0067080 | 6/2005 |
| KR | 10-2005-0094569 | 9/2005 |
| KR | 10-2006-0002337 | 1/2006 |

* cited by examiner

NON-VOLATILE MEMORY DEVICE AND METHOD OF OPERATION THEREFOR

BACKGROUND OF THE INVENTION

1. Field of the Invention

Embodiments of the invention relate to nonvolatile semiconductor memory devices and related methods of operation.

2. Discussion of Related Art

Generally, read and write (programming/erase) operations for memory cells in a nonvolatile semiconductor memory device are carried out by controlling bit line voltages corresponding to selected memory cells. In order to properly drive bit lines voltages during a read or programming operation, contemporary nonvolatile semiconductor memory devices provide one or more input/output circuits to temporarily store the data to be written into or read from the memory cells.

FIG. 1 is a diagram illustrating a conventional nonvolatile semiconductor memory device. As shown, the device includes a memory cell array 10. The memory cell array 10 comprises a plurality of even and odd grouped bit lines (BLe<n:1> and BLo<n:1>), and corresponding strings St of memory cells for storing data received from bit lines (BLe<n:1> and BLo<n:1>) and outputting read data to the bit lines (BLe<n:1> and BLo<n:1>). Each pair of bit lines BLe and BLo is connected to an input/output circuit 20.

FIG. 2 illustrates a portion of the memory cells in the memory cell array 10 in some additional detail. As shown, the memory cell array 10 comprises a plurality of cell strings (Ste<n:1> and STo<n:1>) each respectively connected to one of the bit lines (BLe<n:1> and BLo<n:1>). Each cell string in the illustrated example is formed from a string selection transistor (SST) connected to its corresponding bit line, a ground selection transistor (GST) connected to a common source line (CSL), and a plurality of memory cells (MC) connected in series between the string selection transistor (SST) and the ground selection transistor (GST). As shown in FIG. 1, more than one string may be connected to a bit line (FIG. 2 shows only one string per bit line for clarity).

Each one of the memory cells (MC) comprises a floating-gate transistor having a source, a drain, a floating gate and a control gate. The memory cells (MC) may be programmed using the Channel Hot Electron (CHE) effect or the Fowler-Nordheim (F-N) tunneling effect. These techniques are both conventionally understood.

As shown in FIG. 1, two adjacent bit lines are configured to constitute a pair of bit lines. However, each bit line may be selected in relation to a unique column address. Therefore, in this disclosure the two bit lines, (i.e., an even bit line and an odd bit line) may be referred to individually or collectively as a "bit line" without further differentiation.

FIG. 1 further shows that the memory device includes a row selector 510 and control logic 500. The control logic 500 receives command and address information (e.g., from a host system), and generates control signals to control the operation of the row selector 510 and the input/output circuits 20. The commands may be at least one of a read command and a write command. The address information indicates an address of at least one memory cell in the memory cell array 10. In particular, the control logic 500 decodes the address information into a row address and a column address.

Based on the command and the row address, the control logic 500 controls the row selector 510 to assert the appropriate word lines WLi, string selection transistor (SST) and a ground selection transistor (GST) to select a row of memory cells MC for a read or write operation. Based on the command and the column address, the control logic 500 generates the control signals supplied to the input/output circuits 20 as described in detail below.

As shown in FIG. 1, each input/output circuit 20 includes a bit line biasing and coupling circuit 110, a bit line blocking circuit 120, a page buffer 150 and a column gate 160. Data to be written to a selected memory cell is supplied on a data input line 300. The data is loaded and latched in the page buffer 150 via the associated column gate 160. Data stored in the page buffer 150 is thus provided to bit line BLe or BLo through the bit line (BL) blocking circuit 120 and the BL bias and coupling circuit 110. Thereafter, a programming operation may be performed relative to the selected memory cell. In similar fashion, data read from a selected memory cell is transferred via the BL bias and coupling circuit 110 and the BL blocking circuit 120, and temporarily stored in the page buffer 150. Data thus stored in page buffer 150 may be transferred to an output data line 200 in response to a column gate signal applied to the column gate 160 by the control logic 500.

FIG. 3 illustrates the circuits comprising the input/output circuit 20 in greater detail. As shown, the bit line biasing and coupling circuit 110 includes first and second high voltage transistors 112 and 114 connected in series between the even and odd bit lines BLe and BLO. The node connecting the first and second high voltage transistors 112 and 114 receives a bit line bias BLPWR. As will be appreciated, the bit line bias BLPWR is, generally, either a reference ground voltage Vss or a power supply voltage Vdd. First and second control signals SHLDe and SHLDo are supplied to the gates of the first and second high voltage transistors 112 and 114.

Because, in this example, the first and second high voltage transistors 112 and 114 are NMOS transistors, if the first and second control signals SHLDen and SHLDo are high, then the bit line bias BLPWR is supplied to the even and odd bit lines BLe and BLo to, for example, pre-charge the bitlines. If the first and second control signals SHLDe and SHLDo are low, then the then the bit line bias BLPWR is not supplied to the even and odd bit lines BLe and BLo. In view of the function of the first and second high voltage transistors 112 and 114, these transistors are often referred to as pre-charge transistors because they are used to pre-charge the bit lines.

The bit line biasing and coupling circuit 110 also includes a third high voltage transistor 116 connected to the even bit line BLe and a fourth high voltage transistor 118 connected to the odd bit line BLo. The outputs of the third and fourth high voltage transistors 116 and 118 are connected together and to the bit line blocking circuit 120. The third and fourth high voltage transistors 116 and 118 receive third and fourth control signals BLSLTe and BLSLTo at their gates, respectively. When the third and fourth control signals BLSLTe and BLSLTo are high, the third and fourth high voltage transistors 116 and 118 couple the even and odd bit lines BLe and BLo to the blocking circuit 120. When the third and fourth control signals BLSLTe and BLSLTo are low, the third and fourth high voltage transistors 116 and 118 de-couple the even and odd bit lines BLe and BLo from the blocking circuit 120. As a result, the third and fourth high voltage transistors 116 and 118 are also commonly referred to as de-coupling transistors.

As shown in FIG. 3, the blocking circuit 120 includes a single high voltage transistor connecting the bit line bias and coupling circuit 110 to the page buffer 150. The high voltage blocking transistor 120 receives a fifth control signal SOBLK at its gate. When the fifth control signal SOBLK is high, the high voltage blocking transistor 120 connects the bit line bias and coupling circuit 110 with the page buffer 150. When the fifth control signal SOBLK is low, the high voltage blocking transistor 120 blocks the connection between the bit line bias and coupling circuit 110 and the page buffer 150.

FIG. 3 further shows the details of the page buffer 150. Because the page buffer 150 shown in FIG. 3 is so well known it will not be described in detail for the sake of brevity. It is sufficient to note that the page buffer 150 does include a latch 152 for temporarily storing input or output data with respect to the memory cell array 10.

Also, as further shown in FIG. 3 the column gate 160 includes a transistor connecting the page buffer 150 to the input data line 300 and the output data line 200. The column gate transistor 160 receives a column gate signal YG at its gate. When the column gate signal is high, the input data line 300 and the output data line 200 are connected with the page buffer 150. When the column gate signal YG is low, the input data line 300 and the output data line 200 are disconnected with the page buffer 150.

FIG. 3 further provides an indication of the layout architecture of the memory cell array 10 and the input/output circuit 20. As shown, FIG. 3 indicates that the memory cell array 10 is formed in a cell array or pocket-Pwell region 600 of a semiconductor substrate while the input/output circuit 20 is formed over a high voltage transistor region 700 and a low voltage transistor region 800. More specifically, the bit line bias and coupling circuit 110 and the bit line blocking circuit 120, which include high voltage transistors are formed in a high voltage transistor region 700 of the semiconductor substrate. By contrast, the page buffer 150 and column gate 160 are formed in a low voltage transistor region 800 of the semiconductor substrate.

FIG. 4 illustrates a cross-sectional perspective view of the layout architecture of the memory cell array 10 and input/output circuit 20 shown in FIG. 3. It will be understood that the layout architecture shown in FIG. 4 is not a true cross-section of the semiconductor substrate, but instead, is a side view of the semiconductor substrate. Furthermore it will be understood, that for the sake of clarity, many details to create an operational circuit layout have not been shown. Namely, FIG. 4 is a graphical representation (e.g., the low voltage transistor region 800 including the page buffer 150 has been represented as the Nwell 804 and Pwell 802). Still further, the processing steps and techniques to produce the layout architecture shown in FIG. 4 will not be described as these are well-known and readily understood from FIG. 4. As shown in FIG. 4, a p-type substrate 900 has an N-type well 602 formed therein. A pocket-Pwell 600 is formed in the Nwell 602. The pocket-Pwell (P-Pwell) 600 defines the cell array or pocket-Pwell region 600, and the memory cell transistors are formed in this pocket-Pwell region 600.

FIG. 4 also shows that a Pwell 802 and Nwell 804 are formed in the substrate 900 disposed away from the Nwell region 602. The Pwell region 802 and Nwell region 804 form the low voltage transistor region 800. As graphically shown in FIG. 4, it is in this region that transistors are formed to create the page buffer 150, column gate 160, etc.

The p-type substrate 900 disposed between the Pwell 802 and the Nwell 602 is where the high voltage transistors of the bit line biasing and coupling circuit 110 and the blocking circuit 120 are formed. Namely, the portion of the p-type substrate 900 disposed between the Pwell 802 and the Nwell 602 forms the high voltage transistor region 700. FIG. 4 shows the second, fourth and blocking high voltage transistors 114, 118 and 120 in the high voltage region 700. While FIG. 4 has not been drawn to scale, FIG. 4 does illustrate the size relationship between the transistors formed in the different regions. Namely, FIG. 4 shows that the high voltage transistors, because of their need to transfer and block high voltages, are significantly greater in size then the transistors in the low voltage transistor region 800 or the transistors in the cell array region 600. As a result, a significant portion of the substrate 900 is devoted towards the high voltage transistor region 700.

As mentioned above, the high voltage transistors and the high voltage transistor region 700 are formed relatively large as a result of the high voltages they must withstand during operation. FIG. 5 illustrates an example of an erase operation and the high voltages incurred by the high voltage transistors and the high voltage transistor region 700. As shown, during an erase operation, an erase voltage of about 20 volts is induced on the bit lines BLe and BLo as a result of the pocket-Pwell 600 being biased to 20 volts. However, the gates of the high voltage bit line biasing transistors 112 and 114 are supplied with zero volts to prevent the 20 volt bias from being transferred out upon the conductor upon which the bias control signal BLPWR is received. As shown in FIG. 5, this creates great stress in the high voltage pre-charge transistors 112 and 114, and necessitates their large size.

As further shown in FIG. 5, 20 volts is applied to the gates of the high voltage de-coupling transistors 116 and 118 such that these transistors transfer the 20 volts received along the bit lines BLe and BLo. As shown in FIG. 5, transferring such a high voltage also induces great stress in these transistors, and necessitates the large size of the high voltage de-coupling transistors 116 and 118. The 20 volts transferred by the high voltage de-coupling transistors 116 and 118 is supplied to the high voltage blocking transistor 120, which receives the power supply voltage VDD at its gate. The high voltage blocking transistor 120 throttles the voltage received, such that only a threshold difference of the power supply voltage reaches the low voltage transistor region 800.

SUMMARY OF THE INVENTION

The principles of the present invention have application to various types of non-volatile memories, those currently existing and those contemplated for use in new technology. Implementations of the present invention, however, are described with respect to a flash electrically erasable and programmable read-only memory (EEPROM), wherein the storage elements are floating gates, as exemplary.

In one embodiment, the non-volatile memory device includes a well of a first conductivity type formed in a substrate, and a first plurality of memory cell transistors connected in series to a bit line formed in the well. A buffer is formed in the substrate outside the well and is connected to the bit line. At least one de-coupling transistor is configured to de-couple the buffer from the bit line, and the de-coupling transistor is formed in the well.

For example, the de-coupling transistor may be formed between the first plurality of memory cells and the buffer without an intervening plurality of memory cells.

One embodiment further includes a blocking transistor connected to the de-coupling transistor and formed outside the well. The blocking transistor is configured to selectively cut off the buffer from the bit line.

Another embodiment of the non-volatile memory device also includes a well of a first conductivity type formed in a substrate, and a plurality of memory cell transistors connected in series to a same bit line formed in the well. A buffer is formed in the substrate outside the well and is connected to the bit line. At least one pre-charge transistor may be configured to selectively apply a pre-charge voltage to the bit line, and the pre-charge transistor is formed in the well.

For example, the pre-charge transistor may be formed between the first plurality of memory cells and the buffer without an intervening plurality of memory cells.

One embodiment further includes a blocking transistor connected to the de-coupling transistor and formed outside the well. The blocking transistor is configured to selectively cut off the buffer from the bit line.

Yet another embodiment of the non-volatile memory device includes a well of a first conductivity type formed in a substrate, and a first plurality of memory cell transistors connected in series to a bit line formed in the well. A buffer is formed in the substrate outside the well and is connected to the bit line. At least one de-coupling transistor is configured to de-couple the buffer from the bit line, and the de-coupling transistor is formed in the well. At least one pre-charge transistor is configured to selectively apply a pre-charge voltage to the bit line, and the pre-charge transistor is formed in the well.

One embodiment further includes a blocking transistor connected to the de-coupling transistor and formed outside the well. The blocking transistor is configured to selectively cut off the buffer from the bit line.

In one embodiment, the de-coupling transistor and the pre-charge transistor may be formed between the first plurality of memory cells and the buffer without an intervening plurality of memory cells.

In another embodiment, a second plurality of memory cells are connected in series to the bit line and formed in the well. The de-coupling transistor may be disposed after the first and second pluralities of memory cells along a first direction, while the pre-charge transistor may be disposed between the first and second pluralities of memory cells in the first direction.

A further embodiment of the non-volatile memory device includes a first plurality of memory cell transistors connected in series to a bit line, a second plurality of memory cell transistor connected in series to the bit line, and a buffer connected to the bit line. At least one pre-charge transistor is configured to selectively apply a pre-charge voltage to the bit line, and the pre-charge transistor is formed between the first plurality of memory cells and the second plurality of memory cells along the first direction.

One embodiment further includes a de-coupling transistor configured to decouple the bit line from the buffer, and the de-coupling transistor is disposed after the first and second pluralities of memory cell transistors in the first direction.

A still further embodiment of the non-volatile memory device includes a first region of a substrate having a plurality of memory cell transistors connected in series to a bit line, and a second region of the substrate having a buffer connected to the bit line. At least one de-coupling transistor is configured to de-couple the buffer from the bit line, and the de-coupling transistor is formed in the first region. At least one well in the substrate defines the one of the first and second regions.

An additional embodiment of the non-volatile memory device includes a first region of a substrate having a plurality of memory cell transistors connected in series to a bit line, and a second region of the substrate having a buffer connected to the bit line. At least one pre-charge transistor is configured to selectively apply a pre-charge voltage to the bit line, and the pre-charge transistor is formed in the first region. At least one well in the substrate defines one of the first and second regions.

Another embodiment of the non-volatile memory device includes a first region of a substrate having a plurality of memory cell transistors connected in series to a bit line, and a second region of the substrate having a buffer connected to the bit line. At least one de-coupling transistor is configured to de-couple the buffer from the bit line, and the de-coupling transistor is formed in the first region. At least one pre-charge transistor is configured to selectively apply a pre-charge voltage to the bit line, and the pre-charge transistor is formed in the first region. At least one well in the substrate defines one of the first and second regions.

The present invention also relates to a method of erasing a portion of a non-volatile memory device.

In one embodiment of the method, an erase voltage is applied to a well formed in a substrate. The well includes a plurality of memory cell transistors connected in series to a bit line. The method also involves having a gate of at least one de-coupling transistor float. The de-coupling transistor is formed in the well and is configured to selectively de-couple the bit line from a buffer formed in the substrate outside the well.

One embodiment of the method further includes applying a turn off voltage to a gate of a blocking transistor to turn off the blocking transistor. The blocking transistor is connected to the de-coupling transistor and is formed outside the well. The blocking transistor is configured to selectively cut off the buffer from the bit line.

Another embodiment of the method includes applying an erase voltage to a well formed in a substrate. The well includes a plurality of memory cell transistors connected in series to a bit line. The method also involves having a gate of at least one pre-charge transistor float. The pre-charge transistor is formed in the well and is configured to selectively apply a pre-charge voltage to the bit line.

In one embodiment, the method further includes applying a turn off voltage to a gate of a blocking transistor to turn off the blocking transistor. The blocking transistor is formed outside the well, and the blocking transistor is configured to selectively cut off the buffer from the bit line.

Another embodiment of the method of erasing a portion of a non-volatile memory device includes applying an erase voltage to a well formed in a substrate. The well includes a plurality of memory cell transistors connected in series to a bit line. The method also involves having a gate of at least one de-coupling transistor and at least one pre-charge transistor float. The de-coupling transistor is formed in the well and is configured to selectively de-couple the bit line from a buffer formed in the substrate outside the well. The pre-charge transistor is formed in the well and is configured to selectively apply a pre-charge voltage to the bit line.

BRIEF DESCRIPTION OF THE DRAWINGS

The present invention will become more fully understood from the detailed description given below and the accompanying drawings, wherein like elements are represented by like reference numerals, which are given by way of illustration only and thus are not limiting on the present invention and wherein.

DESCRIPTION OF EXEMPLARY EMBODIMENTS

Example embodiments of the present invention will be described below in detail with reference to the accompanying drawings. The present invention may, however, be embodied in different forms and should not be construed as being limited to only the embodiments set forth herein.

Figure 1:
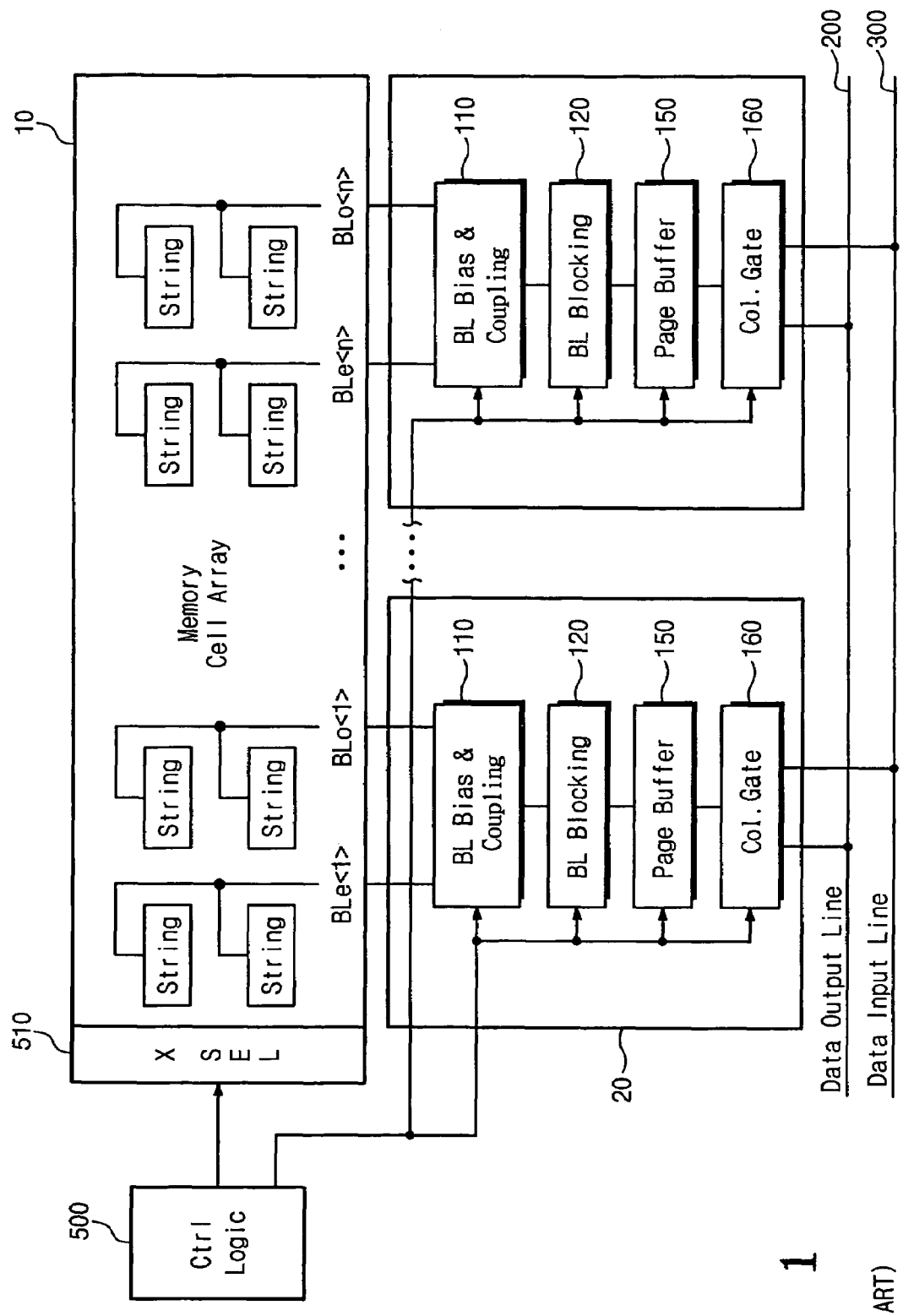
FIG. 1 is a diagram illustrating a prior art nonvolatile semiconductor memory device.
Figure 2:
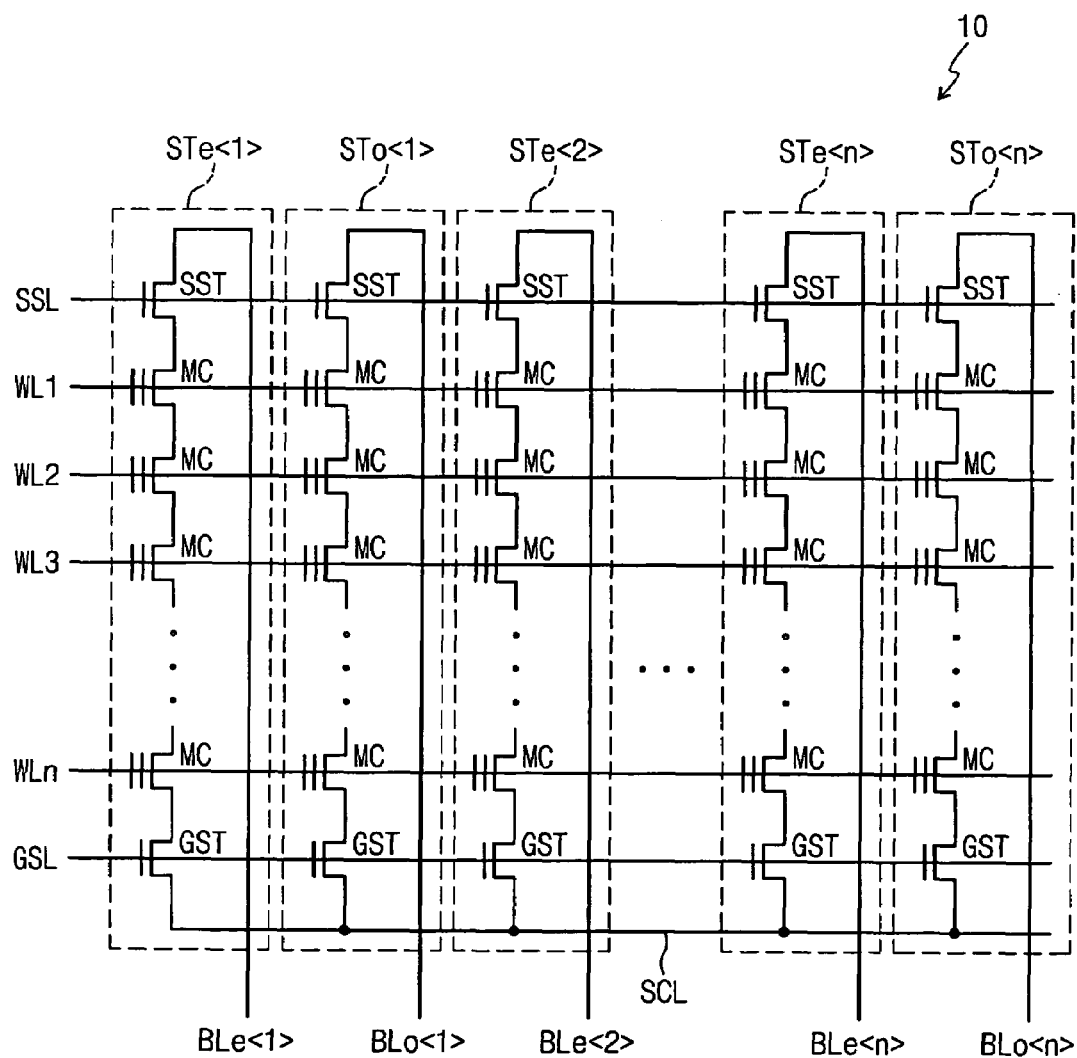
FIG. 2 is a diagram further illustrating the memory cell array shown in FIG. 1.
Figure 3:
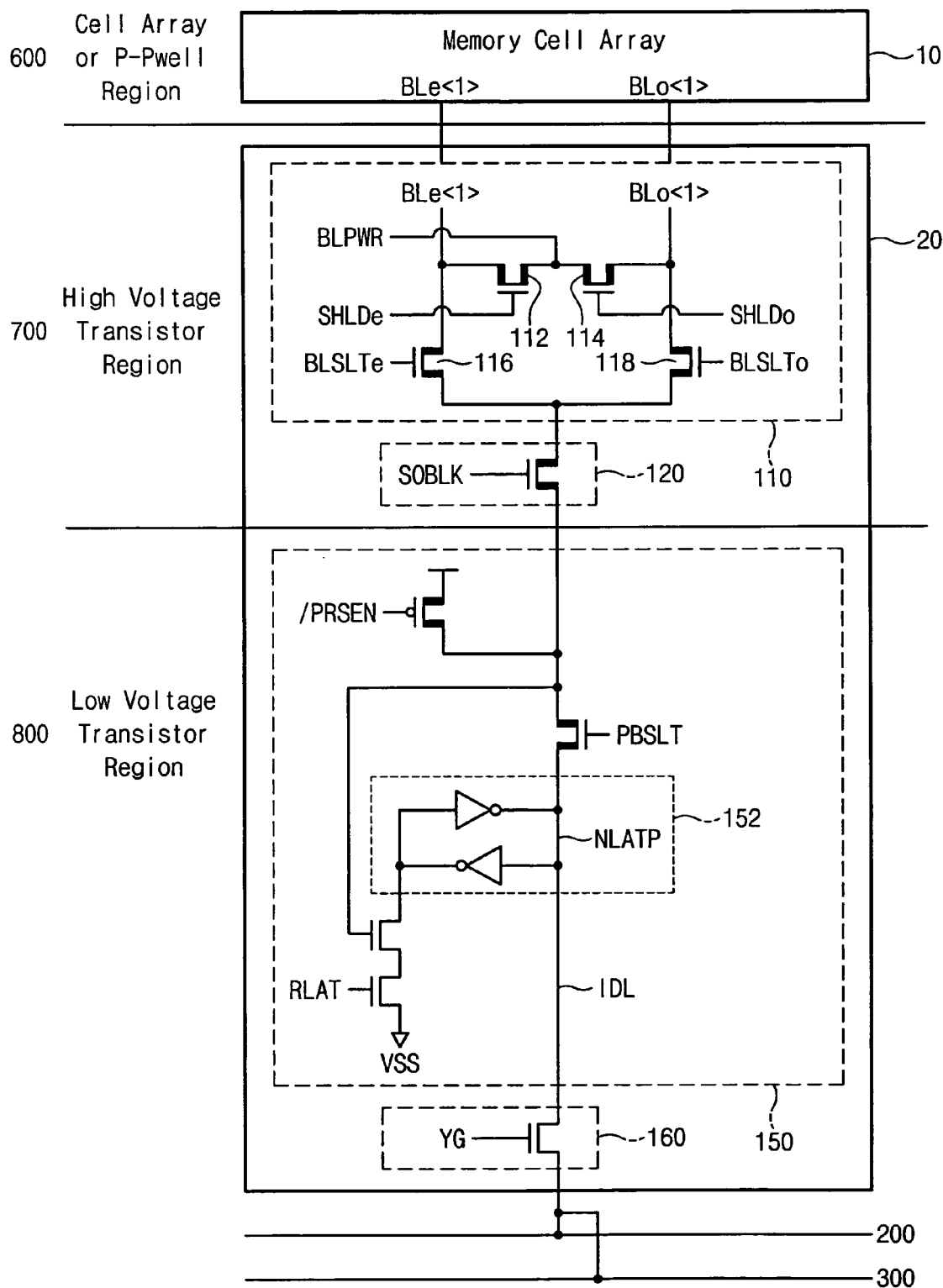
FIG. 3 is a diagram illustrating the input/output circuit, in the prior art nonvolatile semiconductor memory device shown in FIG. 1, in greater detail.
Figure 6:
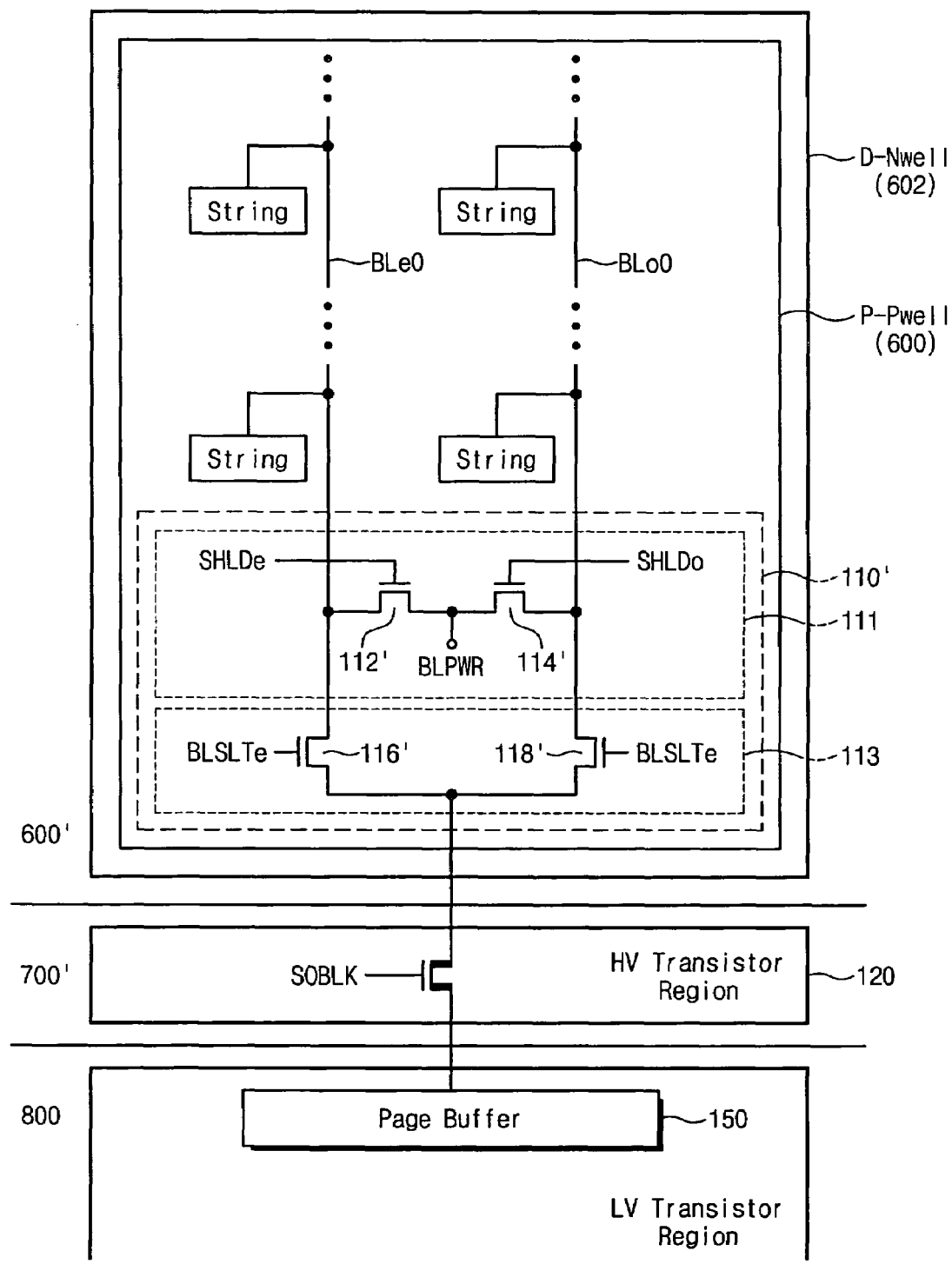
FIG. 6 illustrates a nonvolatile semiconductor memory device in accordance with an embodiment of the present invention.

FIG. 6 illustrates a layout architecture of a non-volatile semiconductor memory device according to an embodiment of the present invention. As shown in FIG. 6, the layout architecture is similar to that of the prior art shown in FIG. 3 except for some important differences. Namely, the high voltage transistor region 700' in FIG. 6 no longer includes the bit line biasing and coupling circuit 110. Instead, as shown in FIG. 6 a bit line biasing and coupling circuit 110' has been formed in the cell array or pocket-Pwell region 600'. As shown, the bit line biasing and de-coupling circuit 110' in FIG. 6 has the same transistor architecture as that of the bit line biasing and coupling circuit 110 shown in FIG. 3, but the first, second, third and fourth transistors 112', 114', 116' and 118' forming the bit line biasing and coupling circuit 110' have been labeled using new references numbers. The new references numbers have been used to demonstrate that the transistors in the bit line biasing and coupling circuit 110' are not the same as in the bit line biasing and coupling circuit 110. Namely, the first, second, third and fourth transistors 112', 114', 116' and 118' are not high voltage transistors. Furthermore, the bitline biasing and coupling circuit 110' has been illustrated as including two circuits: a bitline biasing circuit 111 and a de-coupling circuit 113. The bitline biasing circuit 111 includes the structure of the first and second transistors 112' and 114', and the de-coupling circuit 113 includes the structure of the third and fourth transistor 116' and 118'.

Figure 7:
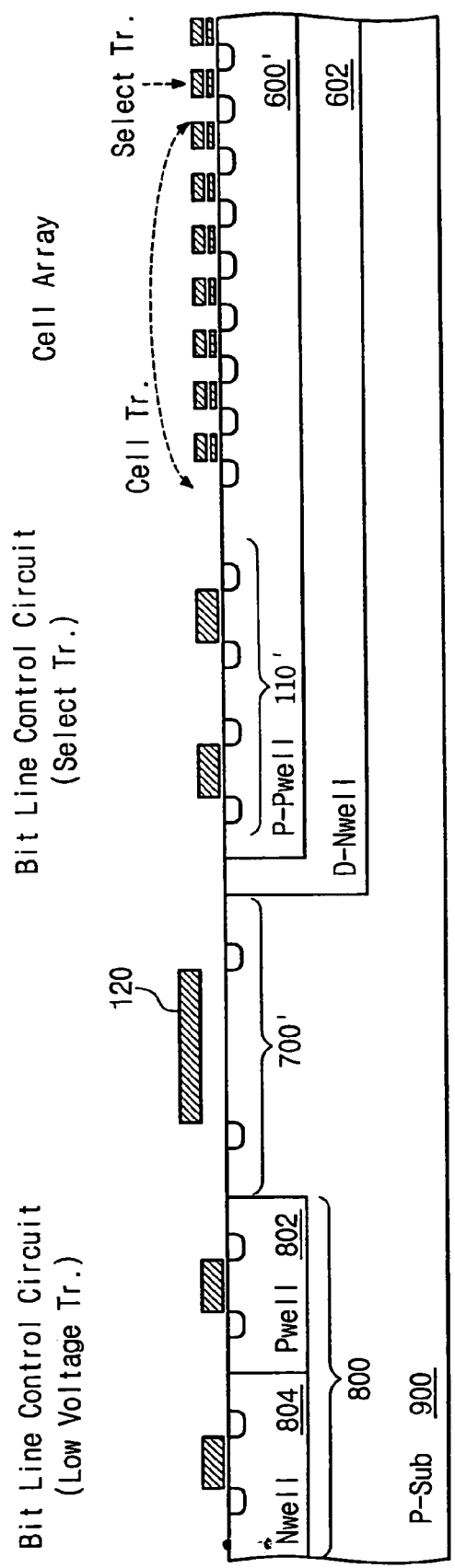
FIG. 7 illustrates a cross-sectional perspective side view of the layout architecture shown in FIG. 6.

FIG. 7 illustrates a cross-sectional perspective side view of the layout architecture shown in FIG. 6. It will be understood that the layout architecture shown in FIG. 7 is not a true cross-section of the semiconductor substrate, but instead, is a side view of the semiconductor substrate. Furthermore it will be understood, that for the sake of clarity, many details to create an operational circuit layout have not been shown. Namely, FIG. 7 is a graphical representation (e.g., the low voltage transistor region 800 including the page buffer 150 has been represented as the Nwell 804 and Pwell 802). Still further, the processing steps and techniques to produce the layout architecture shown in FIG. 7 will not be described as these are well-known and readily understood from FIG. 7. FIG. 7 shows the p-type substrate 900 having the Nwell 602 formed therein. FIG. 7 further shows that the pocket-Pwell 600' is formed in the Nwell 602 and that the transistors of the cell array 10 as well as the transistors of the bit line bias and coupling circuit 110' are formed in the pocket-Pwell region 600'. A Pwell region 802 and Nwell region 804 are also formed in the p-type substrate 900, and comprise the low voltage transistor region 800 in which the page buffer 150 is formed. Disposed between the low voltage transistor region and the Nwell 602 is the portion of the p-type substrate 900 serving as the high voltage transistor region 700'. As FIG. 7 shows, the high voltage transistor region 700' only includes the high voltage blocking transistor 120.

Figure 4:
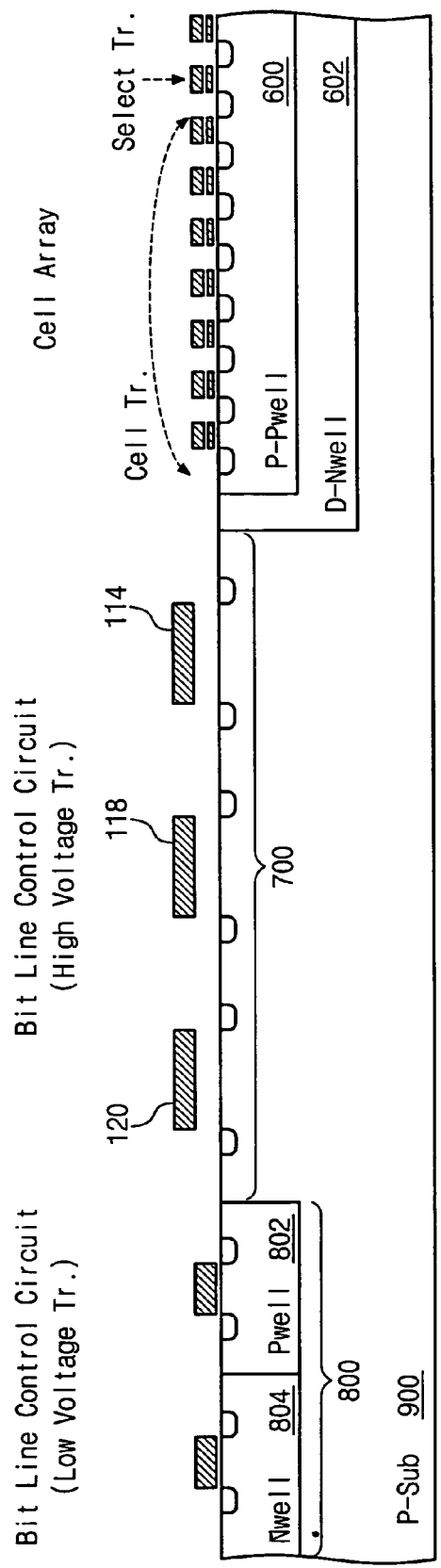
FIG. 4 illustrates a cross-sectional perspective side view of the layout architecture of the memory cell array and input/output circuit shown in FIG. 3.

While not drawn to scale, FIG. 7 is intended to show the size relationship between the transistors formed in the different regions. In particular, FIG. 7 demonstrates that the transistors forming the bit line biasing and coupling circuit 110' are significantly smaller than the high voltage blocking transistor 120. It is also intended, while not drawn to scale, that FIG. 7 illustrate the size difference relationship between the transistors forming the bit line biasing and coupling circuit 110' with respect to the transistors formed in the bit line biasing and coupling circuit 110 shown in FIG. 4. Again, comparison of FIGS. 7 and 4 demonstrates that the transistors in the bit line biasing and coupling circuit 110' are significantly smaller than their counterpart transistors in the prior art of FIG. 4. In particular, the transistors in the bit line biasing and coupling circuit 110' are not high voltage transistors and are one-quarter the size of the high voltage transistors in the bit line biasing and coupling circuit 110.

As will be appreciated, the layout architecture according to this embodiment of the present invention allows for a significantly smaller high voltage transistor region 700' without a commensurate significant increase in the size of the pocket-Pwell region 600'. As such, a noticeable savings in precious semiconductor space is obtained through the layout architecture of the present invention.

Figure 8:
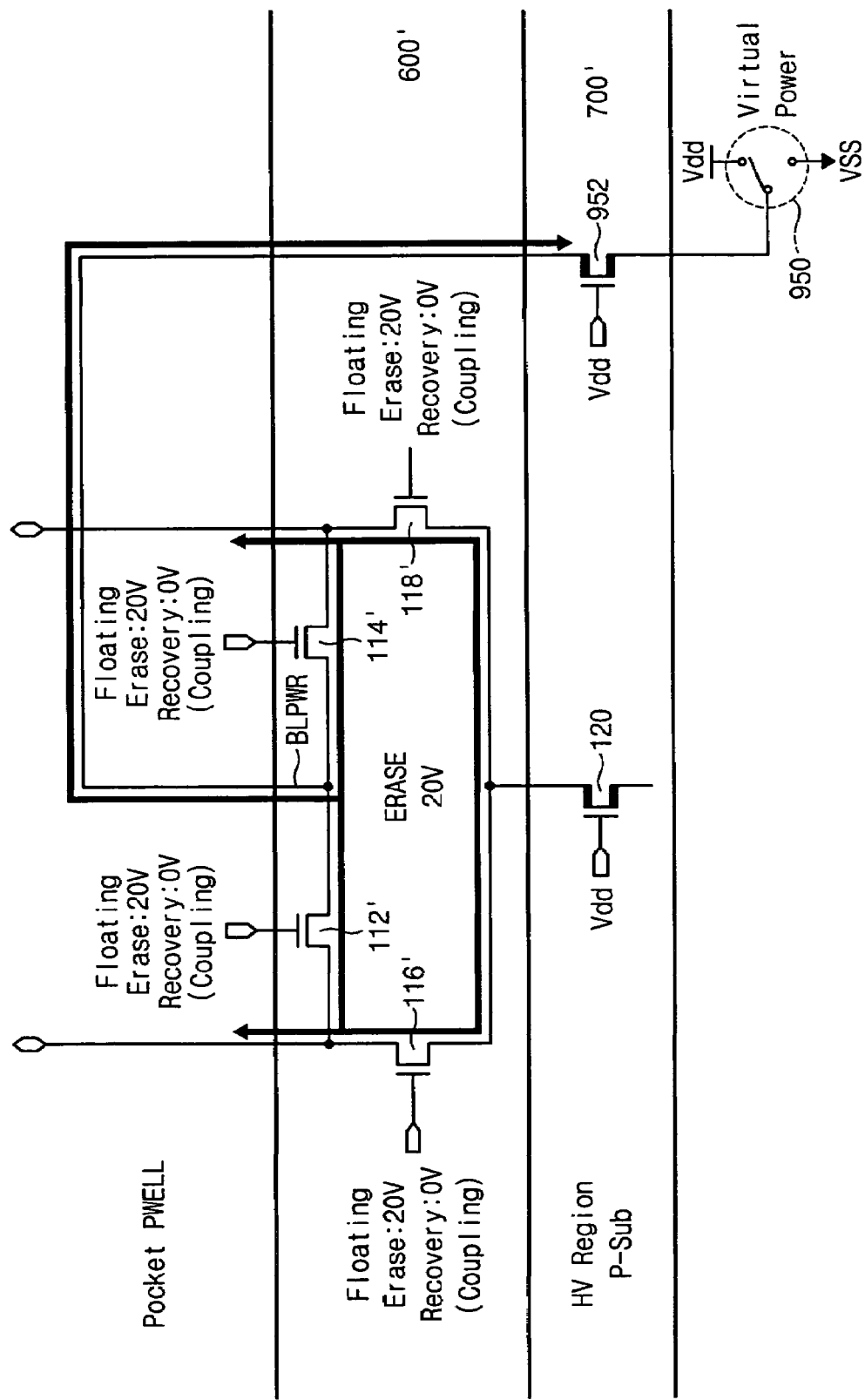
FIG. 8 illustrates an erase operation performed according to an embodiment of the present invention with the layout architecture of FIG. 6.

As described in the Background of the Invention section, the transistors in the bit line biasing and coupling circuit 110 where designed as high voltage transistors because of the high voltage stresses experienced by these transistors. However, in the layout architecture of FIG. 6, these high voltage stresses have been eliminated through the new layout architecture, and this has enabled the use of non-high voltage transistors in the bit line bias and coupling circuit 110'. FIG. 8 provides a representative example of the lack of high voltage stresses experienced by the transistors of the bit line biasing and coupling circuit 110'.

Figure 5:
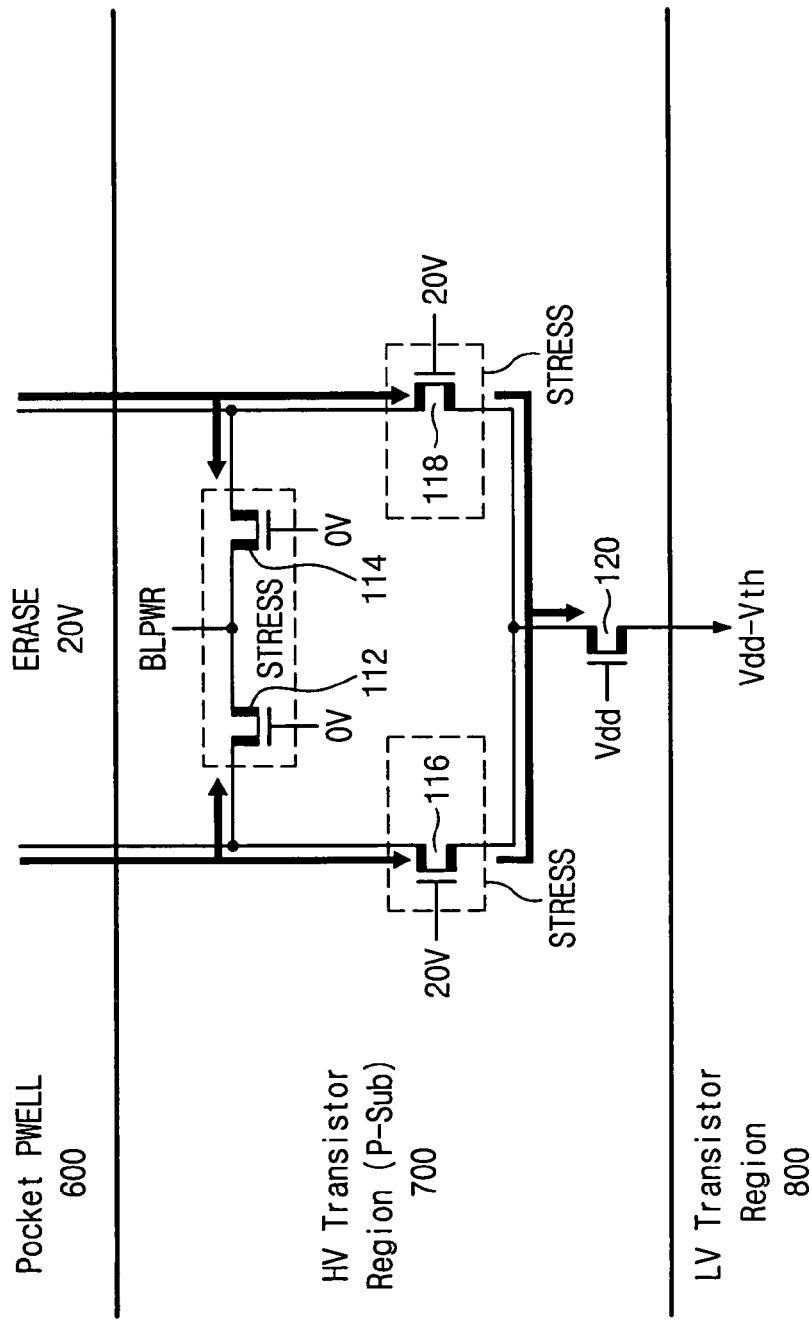
FIG. 5 illustrates an example of an erase operation and the high voltages incurred by the high voltage transistors in the high voltage transistor region of FIG. 3.

As a comparative example to the erase operation illustrated in FIG. 5 with respect to the prior art, FIG. 8 illustrates the erase operation performed with the layout architecture of FIG. 6. As shown, the same 20 volt erase voltage is applied to the P-Pwell 600' in the well-known manner. This induces a substantially 20 volt erase voltage on the bit lines. Each of the pre-charge transistors 112' and 114' have their gates floating. Also, each of the de-coupling transistors 116' and 118' have their gates floating. As a result, stresses are not induced on these transistors, but the voltage does flow out the conductor providing the bit line biasing control signal BLPWR. As shown in FIG. 8, a switch 950 is used to supply either a reference ground voltage Vss or the power supply voltage Vdd as the bit line biasing control signal BLPWR. Furthermore, a high voltage protection transistor 952 is disposed between the switch 950 and the node connecting the pre-charge transistors 112' and 114'. The high voltage protection transistor 952 may be disposed in the high voltage transistor region 700'. The power supply voltage Vdd is supplied to the gate of the high voltage protection transistor 952, such that the high voltage protection transistor 952 shields the switch 950 from the high voltage generated during the erase operation.

As with the embodiment of FIG. 5, the high voltage blocking transistor 120 receives the power supply voltage Vdd at its gate. The high voltage blocking transistor throttles the voltage received, such that only a threshold difference of the power supply voltage reaches the low voltage transistor region 800.

Figure 9:
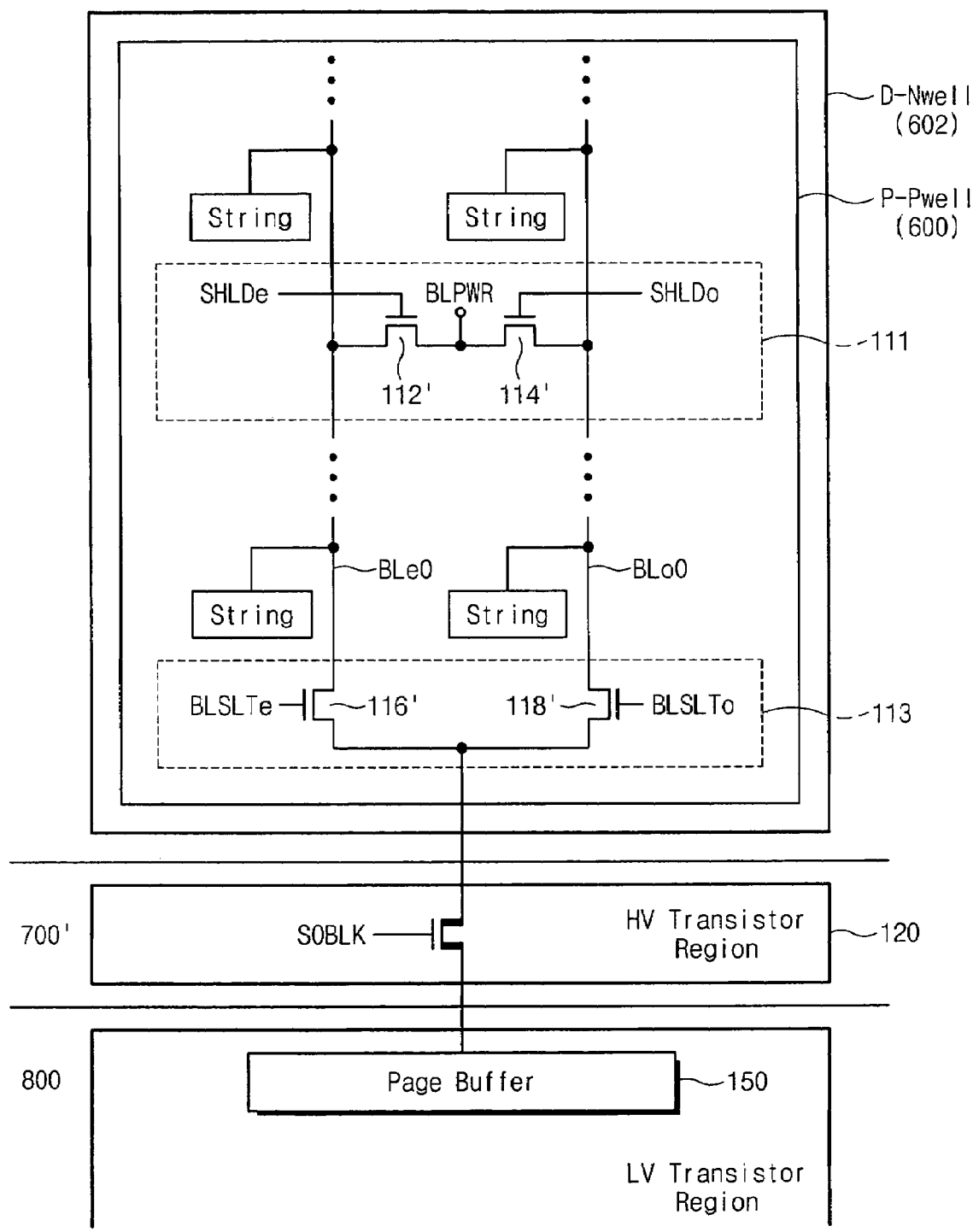
FIG. 9 illustrates another embodiment of a layout architecture according to the present invention.

FIG. 9 illustrates a still further embodiment of the present invention. This embodiment is the same as FIG. 6 except that the bit line biasing circuit 111 and the de-coupling circuit 113 have been separated. In the embodiment of FIG. 6, the bit line biasing circuit 111 and the de-coupling circuit 113 were formed at the end of the P-Pwell region 600' such that no memory cells intervene between the bit line bias and coupling circuit 110' and the page buffer 150. However, in the embodiment of FIG. 9, the bit line biasing circuit 111 is formed within the memory cell array such that memory cells are disposed between the bit line biasing circuit 111 and the page buffer 150. In the embodiment of FIG. 9, the bit line biasing circuit 111 is formed midway in the memory cell array such that an equal number of memory cells are disposed on either side of the bit line biasing circuit 111. It will be understood, however, that other positions for the bit line biasing circuit 111 are possible, and the present invention is not limited to the embodiment shown in FIG. 9.

Although the present invention has been described in connection with several teaching embodiments, it is not limited thereto. It will be apparent to those skilled in the art that various substitutions, modifications and changes may be thereto without departing from the scope of the invention as defined by the following claims.

We claim:

1. A non-volatile memory device, comprising:
a well of a first conductivity type formed in a substrate;
a first plurality of memory cell transistors connected in series to a bit line and formed in the well;
a buffer formed in the substrate outside the well and connected to the bit line;
at least one de-coupling transistor configured to de-couple the buffer from the bit line, the de-coupling transistor being formed in the well; and
a blocking transistor connected to the de-coupling transistor and formed outside the well, the blocking transistor configured to selectively cut off the buffer from the bit line.

2. The device of claim 1, wherein
the de-coupling transistor is formed between the first plurality of memory cells and the buffer without an intervening plurality of memory cells.

3. The device of claim 1, wherein a size of the blocking transistor is greater than a size of the de-coupling transistor.

4. The device of claim 1, wherein the well is a P type well.

5. The device of claim 4, wherein the substrate is a P type substrate, and the P type well is formed within an N type well in the P type substrate.

6. A non-volatile memory device, comprising:
a well of a first conductivity type formed in a substrate;
a first plurality of memory cell transistors connected in series to a bit line and formed in the well;
a buffer formed in the substrate outside the well and connected to the bit line;
at least one de-coupling transistor configured to de-couple the buffer from the bit line, the de-coupling transistor being formed in the well;
at least one pre-charge transistor configured to selectively apply a pre-charge voltage to the bit line, the pre-charge transistor being formed in the well; and
a blocking transistor connected to the de-coupling transistor and formed outside the well, the blocking transistor configured to selectively cut off the buffer from the bit line.

7. The device of claim 6, wherein a size of the blocking transistor is greater than a size of the de-coupling transistor.

8. The device of claim 6, wherein
the de-coupling transistor and the pre-charge transistor are formed between the first plurality of memory cells and the buffer without an intervening plurality of memory cells.

9. The device of claim 8, further comprising:
a blocking transistor connected to the de-coupling transistor and formed outside the well, the blocking transistor configured to selectively cut off the buffer from the bit line.

10. The device of claim 6, wherein the well is a P type well.

11. The device of claim 10, wherein the substrate is a P type substrate, and the P type well is formed within an N type well in the P type substrate.

12. A non-volatile memory device, comprising:
a first region of a substrate including a plurality of memory cell transistors connected in series to a bit line;
a second region of the substrate including a buffer connected to the bit line; and
at least one de-coupling transistor configured to de-couple the buffer from the bit line, the de-coupling transistor being formed in the first region;
at least one well in the substrate defining one of the first and second regions; and
a blocking transistor connected to the de-coupling transistor and formed outside the well, the blocking transistor configured to selectively cut off the buffer from the bit line.

13. The device of claim 12, further comprising:
a third region disposed between the first region and the second region, the third region including a blocking transistor, the blocking transistor connected to the de-coupling transistor between the de-coupling transistor and the buffer, the blocking transistor configured to selectively cut off the buffer from the bit line.

14. A non-volatile memory device, comprising:
a first region of a substrate including a plurality of memory cell transistors connected in series to a bit line;
a second region of the substrate including a buffer connected to the bit line; and
at least one de-coupling transistor configured to de-couple the buffer from the bit line, the de-coupling transistor being formed in the first region;
at least one pre-charge transistor configured to selectively apply a pre-charge voltage to the bit line, the pre-charge transistor being formed in the first region;
at least one well in the substrate defining one of the first and second regions; and
a blocking transistor connected to the de-coupling transistor and formed outside the well, the blocking transistor configured to selectively cut off the buffer from the bit line.

15. The device of claim 14, further comprising:
a third region disposed between the first region and the second region, the third region including a blocking transistor, the blocking transistor connected to the de-coupling transistor between the de-coupling transistor and the buffer, the blocking transistor configured to selectively cut off the buffer from the bit line.

* * * * *